United States Patent [19]

Sandhu

[11] Patent Number: 5,227,334
[45] Date of Patent: Jul. 13, 1993

[54] LPCVD PROCESS FOR DEPOSITING TITANIUM NITRIDE (TIN) FILMS AND SILICON SUBSTRATES PRODUCED THEREBY

[75] Inventor: Gurtej S. Sandhu, Boise, Id.

[73] Assignee: Micron Technology, Inc., Bosie, Id.

[21] Appl. No.: 785,681

[22] Filed: Oct. 31, 1991

[51] Int. Cl.$^5$ .................. H01L 21/441; H01L 21/324
[52] U.S. Cl. .................................... 437/190; 437/192; 437/195; 437/247
[58] Field of Search ................. 437/190, 192, 247, 195

[56] References Cited
U.S. PATENT DOCUMENTS 4,897,709  1/1990  Yokoyama et al. ............ 437/203 X Primary Examiner—John S. Maples
Attorney, Agent, or Firm—William J. Bethurum

[57] ABSTRACT

A process for depositing titanium nitride films on silicon substrates or the like which includes reacting nitrogen trifluoride, $NF_3$, with a titanium containing reactant gas, such as a titanium containing metal organic precursor, in a low pressure chemical vapor deposition reaction chamber. This CVD chamber is preferably a single wafer chamber operated at a pressure between 0.1 and 10.0 Torr and at a elevated temperature on the order of about 500° C. This process is most useful, for example, in the formation of low resistivity, highly conformal coatings of TiN on the surfaces of vias etched vertically in silicon integrated circuits and adapted to receive a selected heavy metal such as tungsten in direct contact therewith.

18 Claims, 1 Drawing Sheet

LPCVD PROCESS FOR DEPOSITING TITANIUM NITRIDE (TIN) FILMS AND SILICON SUBSTRATES PRODUCED THEREBY

TECHNICAL FIELD

This invention relates generally to low pressure chemical vapor deposition (LPCVD) processes for forming thin conductive films, and more particularly to such processes for depositing titanium nitride (TiN) films useful in the manufacture of certain types of integrated circuits.

BACKGROUND ART

The use of titanium nitride films for making electrical connections is generally well known in the art and manufacture of integrated circuits. Titanium nitride has also been widely used in other diverse arts such as the production of wear resistant coatings on machine tools and as decorative coatings on watches and jewelry. Titanium nitride displays an interesting combination of properties, such as optical properties that resemble those of gold and a hardness greater than all elemental metals and sapphire and almost as hard as diamond. Its melting point is almost 3000° C., which is higher than that of most materials, and it is inert to most chemicals and solvents except aqua regia, which dissolves it slowly, and hydrogen fluoride (HF). In addition, titanium nitride is a better electrical conductor than titanium metal.

Titanium nitride is currently being used for making electrical connections between upper level conductors and underlying substrate surfaces of silicon integrated circuits, and it is a preferred conductive material, for example, for making vertical electrical interconnects between a layer of surface conductor (e.g., metal or polysilicon) on a memory chip, such as a dynamic random access memory (DRAM), and an access transistor or stacked capacitor which is fabricated in or on the silicon substrate of the DRAM array. One such connection is shown, for example, in co-pending application Ser. No. 07/734,908 of Fernando Gonzalez et al filed on Jul. 24, 1991, assigned to the present assignee.

Present processes for forming these titanium nitride films include the reaction of either titanium tetrachloride, TiCl4, or a titanium-containing organic precursor in an LPCVD chamber with ammonia, NH3, to deposit the titanium nitride films. Such processes are generally well known in the art and are described, for example, in an article by R. M. Fix et al entitled "Synthesis of Thin Films by Atmospheric Pressure Chemical Vapor Deposition Using Amido and Imido Titanium (IV) Compounds as Precursors", *Chemical Materials*, Volume 2, No. 3, at pages 235-241, 1990, incorporated herein by reference.

Whereas these prior art titanium nitride film deposition processes have proven satisfactory in some respects, the conformality of these TiN films has been unacceptably low as a result of the highly reactive nature of the NH3 molecule and the fact that the NH3 molecule almost completely reacts with the titanium-containing reactant gas before it reaches the surface upon which it is desired to deposit a TiN film. This fact, in turn, causes the TiN compound to fall vertically downward in the reaction chamber being used and deposit out primarily on the horizontal receiving surfaces of IC structures being manufactured, but deposit very little TiN on the exposed vertical side walls of the IC structures, resulting in poor overall conformality of the deposited TiN coating.

Another disadvantage associated with the above NH3 type titanium nitride deposition process resides in the fact that the resistivity of the deposited titanium nitride films have in some cases been unacceptably high. Using these prior art TiN film producing processes, there is a strong tendency for the ratio of Ti to N in the TiN compound molecule to remain 1:1 regardless of variations introduced into conventional TiN film forming processes. A result of the high resistivity of the titanium nitride films thus produced is that it has the undesirable effect of limiting the amount of titanium silicide, $TiSi_2$, which forms at the point that the TiN film makes contact with the silicon substrate. This fact, in turn, increases the contact resistance, Rc, within the integrated circuits being manufactured and thereby increases the heat dissipation and power losses therein.

DISCLOSURE OF INVENTION

In accordance with the present invention, it has been discovered that by reacting a chosen titanium-containing reactant precursor such as tetramethylamidotitanium (TMAT) with nitrogen trifluoride, $NF_3$, instead of ammonia, $NH_3$, the ratio of titanium to nitrogen in the titanium nitride compound can be increased to thereby raise the conductivity of the titanium nitride film while simultaneously increasing the conformality of the deposited titanium nitride films. The conformality of these TiN films is increased by the fact that more of the TiN compound film forming reaction takes place at the surface of the integrated circuit structure being coated. Simultaneously, by increasing the number of available titanium atoms in the TiN film, this increases the amount of titanium silicide that is formed on the silicon substrate contact areas, thereby lowering the contact resistance, Rc, of these areas and reducing power and heat dissipation losses within the IC structure. Thus, the novel preferred titanium nitride film forming chemical reaction as claimed herein proceeds in accordance with the following equation:

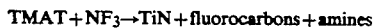

$$TMAT + NF_3 \rightarrow TiN + \text{fluorocarbons} + \text{amines}$$

Accordingly, the general purpose and principal object of this invention is to provide a new and improved titanium nitride film forming chemical vapor deposition process of the type described which operates to simultaneously increase the conformality of the TiN films and reduce their contact resistance, Rc, to silicon.

Another object of this invention is to provide a new and improved process of the type described which serves to minimize power and heat dissipation losses in certain types of integrated circuits.

A novel feature of this invention as an article of manufacture having separate and distinct utility and useful in the formation of integrated circuits is a silicon substrate coated with TiN films produced by the reaction of $NF_3$ and a selected titanium-containing reactant gas such as TMAT.

Another novel feature of this invention is the utilization of the above TiN film forming reaction to deposit a TiN coating on vias which have been etched through surface layers on a silicon substrate. The TiN coated vias then provide an excellent low resistivity high structural integrity interface layer for receiving a vertical tungsten post to fill up the via and provide high quality multi-level conductor interconnections.

The above brief summary of the invention together with its attendant advantages and novel features will become better understood from the following description of the accompanying drawing.

DETAILED DESCRIPTION OF THE DRAWING

Figure 1:
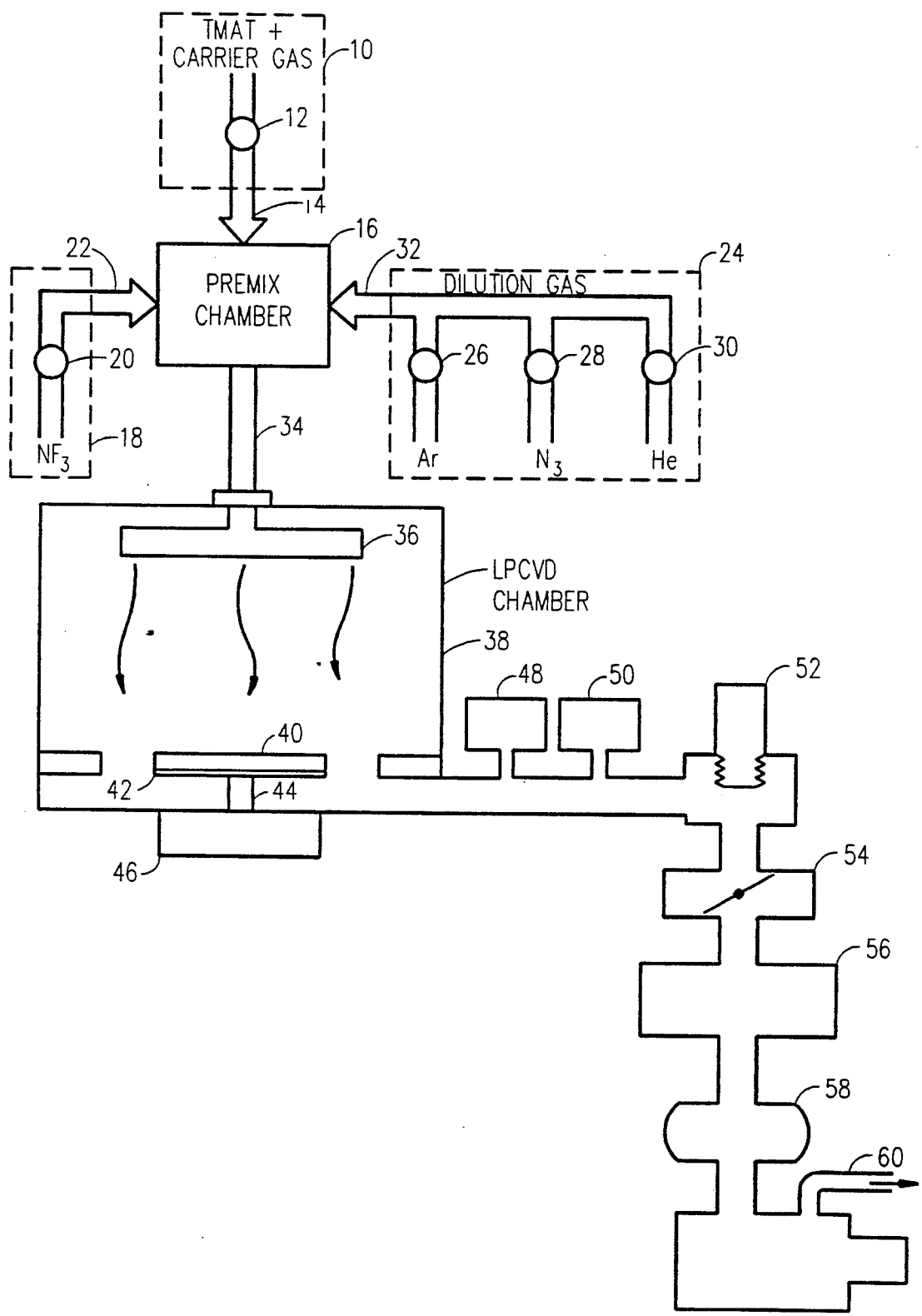
FIG. 1 is a schematic process flow diagram of a cold wall, chemical vapor deposition system which may be used in practicing the process according to the present invention.

Referring now to FIG. 1, a source 10 of titanium-containing organic precursor, such as TMAT, mixed with a suitable carrier gas such as helium, argon, nitrogen or the like and including a gas flow control valve 12 is connected through one input line 14 to a gas premixing chamber 16. Similarly, a source 18 of nitrogen trifluoride, $NF_3$, is connected through a gas flow control valve 20 and a second input line 22 to the premixing chamber 16. A gas source 24 of a suitable dilution gas, such as either argon, nitrogen, or helium is connected through one of the gas flow control valves 26, 28, and 30, and then into a main carrier gas flow line 32 and applied as a third gas input to the premixing chamber 16.

In a preferred embodiment of the invention, the dilution carrier gas from the source 24 is helium which is applied at a flow rate of fifty (50) standard cubic centimeters per minute (sccm). The flow rate of the $NF_3$ gas from the gas source is set to approximately two-hundred (200) sccm. The flow rate of the carrier gas plus TMAT precursor gases entering the premixing chamber 16 through the input line 14 from source 10 will typically be set to approximately fifty (50) sccm with the TMAT flow rate set at 5 sccm.

The above gases which are introduced into the premixing chamber 16 are thoroughly mixed within the premixing chamber 16 and are then passed by way of an output line 34 and through an associated shower head 36 into a main CVD reaction chamber 38. In the chamber 38, individual silicon wafers 40 are mounted as shown on a graphite boat 42 which is supported by a post member 44 on the lower wall of the CVD chamber 38. The graphite boat 42 is heated using convection heating by a halogen lamp 46 which is controlled to elevate the temperature within the LPCVD chamber 38 to approximately 500° C.

As the gases $NF_3$, TMAT, and helium carrier gases from the sources 18, 10, and 24 intermix inside the CVD reaction chamber 38, they begin to react to thereby deposit a uniform film of titanium nitride upon the heated surfaces of the silicon wafer 40, including any interconnect vias which have been formed therein. The deposition pressure within the CVD reaction chamber 38 is monitored and maintained by the use of conventional pressure control components consisting of a pressure sensor 48, a pressure switch 50, an air operating vacuum valve 52 and a pressure control valve 54. The reaction by-product gases given off by the chemical reaction taking place in the CVD reaction chamber 38 pass through a particulate filter 56 and then through a blower 58 before exhausting through an output vent line 60.

In carrying out the above process, a predetermined pressure of between 0.1 and 10.0 Torr was pulled within the reaction chamber 38, and after a deposition time of approximately ten (10) minutes, a secondary ion mass spectroscopy (SIMS) analysis indicated that approximately 300 Angstroms of titanium nitride had been deposited on the exposed silicon surface of the wafer 40 without optimizing the process. As compared to a resistivity of approximately 3000 $\mu$ohm.cm obtained by using the above described prior art processes, the measured resistivity of the titanium nitride films produced in accordance with the present invention was measured to be about 1000 $\mu$ohm cm and having a conformality of about 50% as compared to the prior art conformality of about 10%.

In comparing the present TiN film forming process using $NF_3$ to the $NH_3$-titanium nitride film forming process of the prior art, experimentation has shown that using $NH_3$, the available number of available Ti atoms tends to remain constant as the film deposition process continues. On the other hand, however, using the novel $NF_3$-TiN film forming process according to the present invention, the number of available Ti atoms has been shown to increase with time and increase in TiN film thickness as the TiN film forming process is carried out. This experimentation, in turn, conclusively establishes that the number of Ti atoms available at the silicon substrate surface for the formation of titanium silicide is increased, and that the amount of $TiSi_2$ formed is also increased to thereby lower the contact resistance, Rc, to silicon. Therefore, not only does the present process greatly increase the conformality of the deposited TiN films, but it simultaneously operates to lower the contact resistance, Rc, and reduce heat and power dissipation losses within the integrated circuit being manufactured. When using the above described titanium nitride film deposition process for forming vertical electrical interconnects in silicon integrated circuits, a selected heavy metal such as tungsten may be deposited in contact with a TiN coating in order to fill up vias in the integrated circuit which expose areas of an underlying silicon substrate.

Various modifications may be made in and to the above described preferred process parameters, precursor selection, and the selected carrier gas without departing from the scope of this invention. In addition, the present invention is not limited to the particular CVD gas flow control system shown in FIG. 1 and may instead be used with other and different CVD film deposition systems which are known and available in the art. Furthermore, the particular gas flow rates and pressures pulled with the LPCVD reaction chamber 38 may also be varied by those skilled in the art without departing from the scope of this invention. Accordingly, these and other process modifications are clearly within the scope of the following appended claims.

I claim:

1. A process for depositing titanium nitride films on silicon substrates which includes the steps of:
    a. heating a silicon substrate to an elevated temperature within a reaction chamber operated at a negative pressure, and
    b. introducing a mixture of tetramethylamidotitanium (TMAT), nitrogen trifluoride, and a selected carrier and dilution gas into said reaction chamber to deposit titanium nitride films on the surface of said silicon wafer in accordance with the following equation:

$$TMAT + NF_3 \rightarrow TiN + fluorocarbons + amines.$$

2. The process defined in claim 1 wherein said titanium containing reactant gas is TMAT and said selected carrier and dilution gas is helium.

3. The process defined in claim 1 wherein said silicon substrate is heated to a temperature of approximately 500° C. at a preselected pressure between 0.1 and 10.0 Torr.

4. The process defined in claim 1 wherein said TMAT and said carrier and dilution gas are passed into a premixing chamber at a flow rate of about 50 sccm and said $NF_3$ flow rate is set at about 200 sccm.

5. The process defined in claim 2 wherein said silicon substrate is heated to a temperature of approximately 500° C. at a preselected pressure of between 0.1 and 10.0 Torr.

6. The process defined in claim 5 wherein said TMAT and said carrier and dilution gas are passed into a premixing chamber at a flow rate of about 50 sccm and said $NF_3$ flow rate is set at about 200 sccm.

7. A process for forming vertical electrical interconnects in silicon integrated circuits which includes the steps of:
   a. providing a silicon substrate having layers of conductor and dielectric thereon,
   b. opening vias through said conductor or dielectric layers to expose a surface area of said silicon substrate,
   c. exposing said substrate to a mixture of a tetramethylamidotitanium (TMAT), nitrogen trifluoride, and a selected carrier and dilution gas in a CVD reaction chamber to deposit a titanium nitride coating on the surface of said silicon substrate in accordance with the following equation:

$$TMAT + NF_3 \rightarrow TiN + fluorocarbons + amines$$

and,
   d. depositing a selected heavy metal in contact with said TiN coating to fill up said vias.

8. The process defined in claim 7 wherein said selected carrier and dilution gas is helium.

9. The process defined in claim 7 wherein said silicon substrate is heated to a temperature of approximately 500° C. at a preselected pressure between 0.1 and 10.0 Torr.

10. The process defined in claim 7 wherein said TMAT and said carrier and dilution gas are passed into a premixing chamber at a flow rate of about 50 sccm and said $NF_3$ flow rate is set at about 200 sccm.

11. The process defined in claim 8 wherein said silicon substrate is heated to a temperature of approximately 500° C. at a preselected pressure of between 0.1 to 10.0 Torr.

12. The process defined in claim 11 wherein said TMAT and said carrier and dilution gas are passed into a premixing chamber at a flow rate of about 50 sccm and said $NF_3$ flow rate is set at about 200 sccm.

13. A process for forming a TiN film on a selected substrate which includes reacting $NF_3$ with tetramethylamidotitanium, TMAT in the presence of said substrate.

14. The process defined in claim 13 wherein the reaction is carried out in a chemical vapor deposition chamber at an elevated temperature and a negative pressure.

15. The process defined in claim 14 wherein the reaction proceeds in accordance with the following equation:

$$TMAT + NF_3 \rightarrow TiN + fluorocarbons + amines.$$

16. The process defined in claim 15 wherein said TiN films are formed within vias on integrated circuit substrates and then coated with tungsten.

17. The process defined in claim 13 wherein said titanium nitride films are formed within vias on integrated circuit substrates and then coated with tungsten.

18. The process defined in claim 17 wherein the reaction is carried out in a chemical vapor deposition chamber at a predetermined elevated temperature on the order of about 500° C. and a predetermined pressure between 0.1 and 10.0 Torr.

* * * * *